United States Patent
Bogner et al.

(10) Patent No.: US 10,361,694 B2
(45) Date of Patent: Jul. 23, 2019

(54) SWITCHING CIRCUITRY, DC-INTERFACE AND METHOD FOR OPERATING A SWITCHING CIRCUITRY

(71) Applicant: Infineon Technologies AG, Neubiberg (DE)

(72) Inventors: Peter Bogner, Wernberg (AT); Herwig Wappis, Drobollach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/783,718

(22) Filed: Oct. 13, 2017

(65) Prior Publication Data

US 2018/0145673 A1 May 24, 2018

(30) Foreign Application Priority Data

Nov. 24, 2016 (DE) .......................... 10 2016 223 354

(51) Int. Cl.
| | |
|---|---|
| H03B 1/00 | (2006.01) |
| H03K 3/00 | (2006.01) |
| H03K 17/08 | (2006.01) |
| H02M 3/07 | (2006.01) |
| H03K 17/081 | (2006.01) |

(52) U.S. Cl.
CPC .............. *H03K 17/08* (2013.01); *H02M 3/07* (2013.01); *H03K 17/08104* (2013.01); *H03K 2217/0063* (2013.01); *H03K 2217/0081* (2013.01)

(58) Field of Classification Search
CPC ............. H03K 17/08; H03K 17/08104; H03K 2217/0063; H03K 2217/0081; H02M 3/07

USPC .......................................................... 327/109
See application file for complete search history.

(56) References Cited

U.S. PATENT DOCUMENTS

| | | | |
|---|---|---|---|
| 3,717,868 A | 2/1973 | Crawford et al. | |
| 7,683,668 B1* | 3/2010 | Thakur | H03K 3/356165 326/68 |
| 8,022,745 B1* | 9/2011 | Dening | H03K 17/102 327/309 |
| 2004/0189275 A1 | 9/2004 | Yoneyama | |
| 2009/0115489 A1 | 5/2009 | Hemon et al. | |

(Continued)

OTHER PUBLICATIONS

Office Action, in the German language, from counterpart German Application No. 102016223354.8, dated Oct. 16, 2017, 9 pp.

*Primary Examiner* — Metasebia T Retebo
(74) *Attorney, Agent, or Firm* — Shumaker & Sieffert, P.A.

(57) ABSTRACT

A switching circuitry is configured to provide, during an ON-State, a connection between a first port and second port and to electrically disconnect, during an OFF-State, the first port from the second port. The switching interface comprises a first and a second cascode transistor element having an applicable operational voltage and comprising a control terminal, wherein the first cascode transistor element is connected with the first port of the switching interface and wherein the second cascode transistor element is connected with the second port of the switching interface. The switching interface comprises a switching transistor element, having the applicable operational voltage and comprising a third control terminal, the switching transistor element being serially connected the first and second cascode transistor elements. A supply signal arrangement is connected to the control terminals and configured to provide control voltages to the control terminals.

25 Claims, 6 Drawing Sheets

(56) References Cited

U.S. PATENT DOCUMENTS

| | | | |
|---|---|---|---|
| 2012/0248416 A1* | 10/2012 | Zhou | B82Y 10/00 257/29 |
| 2013/0049813 A1 | 2/2013 | Sato et al. | |
| 2014/0002051 A1 | 1/2014 | Grimm et al. | |
| 2015/0207513 A1* | 7/2015 | Tsunoda | H03L 7/0895 327/66 |
| 2016/0241234 A1 | 8/2016 | Mavretic | |

* cited by examiner

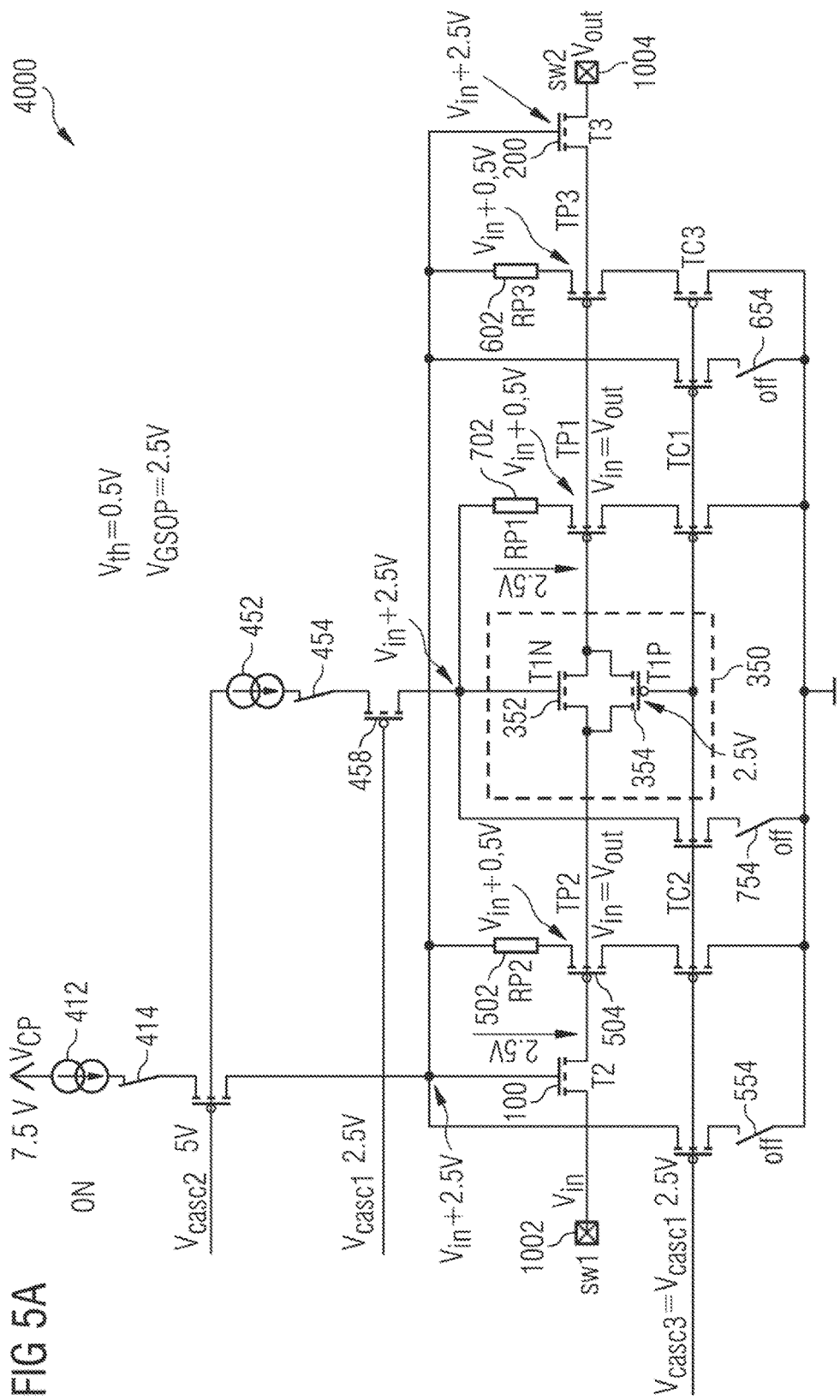

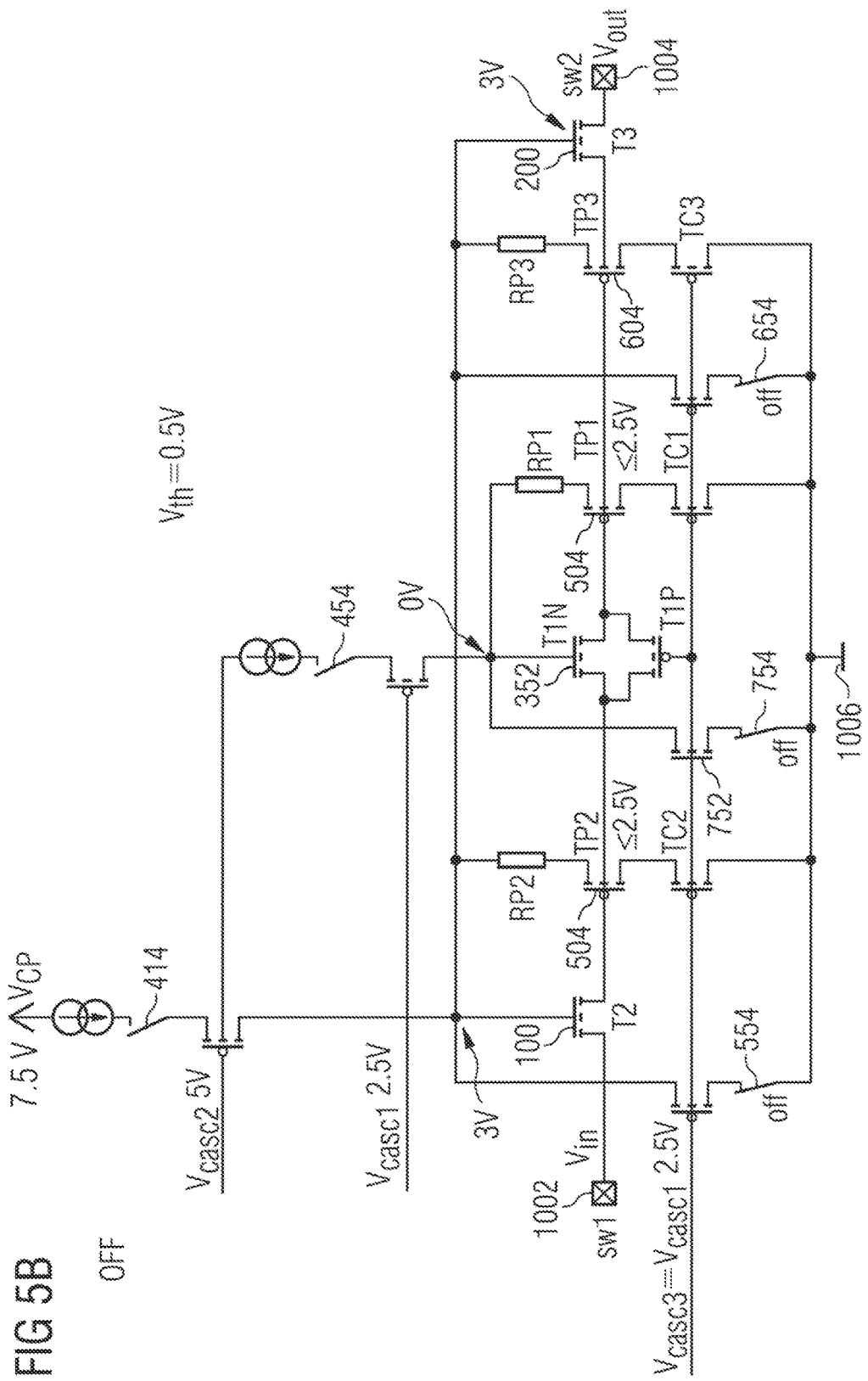

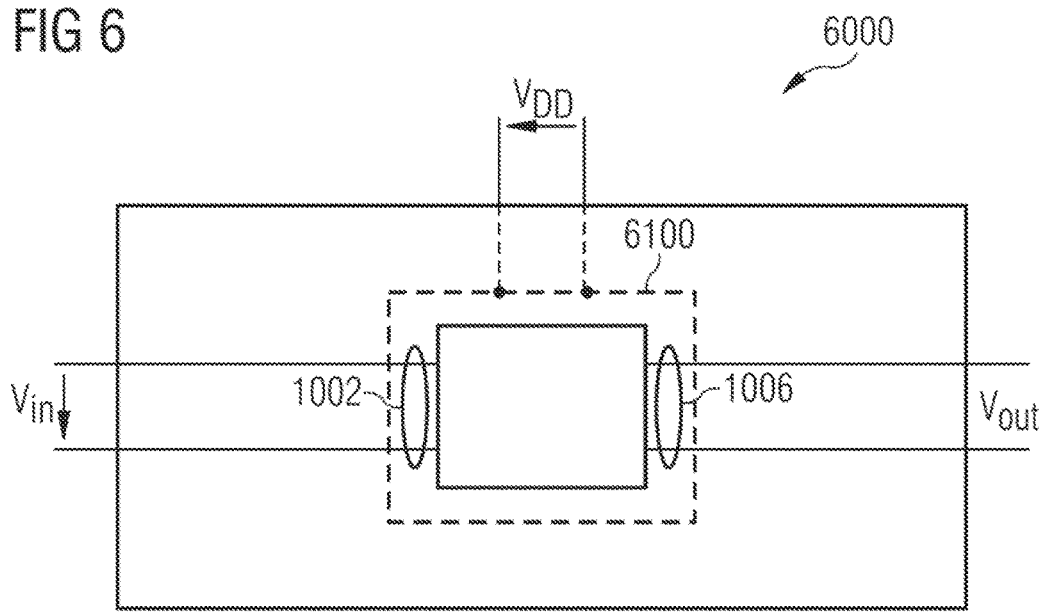

SWITCHING CIRCUITRY, DC-INTERFACE AND METHOD FOR OPERATING A SWITCHING CIRCUITRY

This Application claims priority to German Patent Application No 102016223354.8, filed on Nov. 24, 2016, the entire content of which is incorporated herein by reference.

TECHNICAL FIELD

Embodiments relate to switching circuitries. Embodiments further relate to a DC-interface comprising a switching circuitry and to a method for operating a switching circuitry. Other embodiments also relate to a medium voltage input switch with a protected low voltage transistor.

Technical Background

Historically, plenty of applications use a five volt interface in analogue and digital (IOs). In this application this voltage will then also appear at the power supply. Devices and circuits use a power supply provided by a switching circuitry for operation.

SUMMARY

A concept to use switching elements such as transistors comprising a voltage class being below or less than a voltage to be switched is disclosed. By adjusting control voltages of transistor elements, the transistor elements may be used to switch voltages greater than their applicable operational voltage.

Embodiments provide a switching circuitry to provide, during an ON-State, a connection between a first port configured for receiving an input voltage and a second port and to electrically disconnect, during an OFF-State, the first port from the second port. The switching circuitry comprises a first cascode transistor element, a second cascode transistor element and a switching transistor element. The first cascode transistor element, the second cascode transistor element and the switching transistor element have an applicable operational voltage and comprise a control terminal each. The first cascode transistor element is connected with the first port of the switching interface. The second cascode transistor element is connected to the second port of the switching interface. The switching transistor element is serially connected between the first and the second cascode transistor elements. The switching circuitry comprises a supply signal arrangement connect to the control terminal of the first cascode transistor element, to the control terminal of the second cascode transistor element and to the control terminal of the switching transistor element. The supply signal arrangement is configured to provide a first control voltage to the first control terminal of the first cascode transistor element, to provide a second control voltage to the second control terminal of the second cascode transistor element and to provide a third control voltage to the third control terminal of the switching transistor element. The first cascode transistor element is connected to a first adjusting circuitry. The first adjusting circuitry is connected between the first control terminal and a reference potential and is configured to adjust the first control voltage, so that, during the ON-State, the voltage difference between the first control voltage and the input voltage is less than or equal to the applicable operational voltage, a voltage above which the transistor element might be damaged during operation. The second cascode transistor element is connected to a second adjusting circuitry. The second adjusting circuitry is connected between the second control terminal and the reference potential and is configured to adjust the second control voltage, so that, during the ON-State, the voltage difference between the second control voltage and the input voltage is less than or equal to the applicable operational voltage. The switching transistor element is connected to a third adjusting circuitry. The third adjusting circuitry is connected between the third control terminal and the reference potential and is configured to adjust the third control voltage, so that, during the ON-State, the voltage difference between the third control voltage and the input voltage is less than or equal to the applicable operational voltage. A maximum voltage level of the input voltage is higher than the applicable operational voltage. Adjusting the control voltage at the first cascode transistor element, at the second cascode transistor element and at the switching transistor element allows of adjusting the voltage-induced workload of the transistor elements to a level at which they remain undamaged although switching a voltage being above the applicable operational voltage. This may allow avoiding high voltage transistors in the switching interface and/or allow using low voltage transistors and may thus allow reduced complexity.

Another embodiment provides a DC-interface comprising an aforementioned switching circuitry. Such a DC-interface may comprise a low level of complexity, wherein the low level of complexity may allow for rapid production as a low number of manufacturing steps may be carried out for manufacturing.

Another embodiment provides a method for operating a switching circuitry receiving an input voltage, the switching circuitry being operated in an ON-State and an OFF-State. The method comprises providing, during the ON-State, a connecting between a first port and a second port and electrically disconnecting, during the OFF-State, the first port from the second port. The switching circuitry comprises a first cascode transistor element having an applicable operational voltage and comprising a first control terminal, the first cascode transistor element being connected with the first port of the switching circuitry. The switching circuitry further comprises a second cascode transistor element also having the applicable operational voltage and comprising a second control terminal, the second cascode transistor element being connected with the second port of the switching circuitry. The switching circuitry further comprises a switching transistor element also having the applicable operational voltage and comprising a third control terminal, the switching transistor element being serially connected between the first and second cascode transistor elements. The method comprises providing a first control voltage to the first control terminal, providing a second control voltage to the second control terminal and providing a third control voltage to the third control terminal. The method further comprises adjusting the first control voltage by means of a first source follower connected to the first cascode transistor element, so that, during the ON-State, the voltage difference between the first control voltage and the input voltage is less than or equal to the applicable operational voltage. The method further comprises adjusting the second control voltage by means of a second source follower connected to the second cascode transistor element, so that, during the ON-State, the voltage difference between the second control voltage and the input voltage is less than or equal to the applicable operational voltage. The method further comprises adjusting the third control voltage by means of a third source follower connected to the switching transistor element, so that, during the ON-State, the voltage difference between the third control voltage and the input voltage is less than or equal to the applicable operational voltage. A maximum voltage level of the input voltage level is higher than the recommended operational voltage.

Further embodiments provide another method for operating a switching circuitry receiving an input voltage between an ON-State and an OFF-State. The method comprises providing, during the ON-State, a connection between a first port and a second port and electrically disconnecting, during the OFF-State, the first port from the second port. The switching circuitry comprises switching circuitry sections arranged in series between a first port and a second port, wherein each switching circuitry section comprises a transistor element. A first transistor element is arranged between a second and a third transistor element and connected in series hereto. The method comprises applying the input voltage at the first port such that the input voltage comprises a maximum voltage level being higher than an applicable operational voltage of the first, second and third transistor elements. The method further comprises controlling a control voltage of the first, second and third transistor elements of the switching circuitry sections such that, during the ON-State, an operational voltage of the first, second and third switching transistor elements between a control terminal and a power terminal of the switching transistor elements is less than or equal to the applicable operational voltage of the first, second and third switching transistor elements.

Embodiments are described herein making reference to the appended drawings.

FIG. 5a shows a schematic block diagram of the switching circuitry of FIG. 4 being in an ON-State, according to an embodiment;

FIG. 5b shows a schematic block diagram of the switching circuitry of FIG. 4 being in an OFF-State, according to an embodiment; and FIG. 6 shows a schematic block diagram of a DC-interface according to an embodiment.

DETAILED DESCRIPTION OF THE EMBODIMENTS

Figure 1:
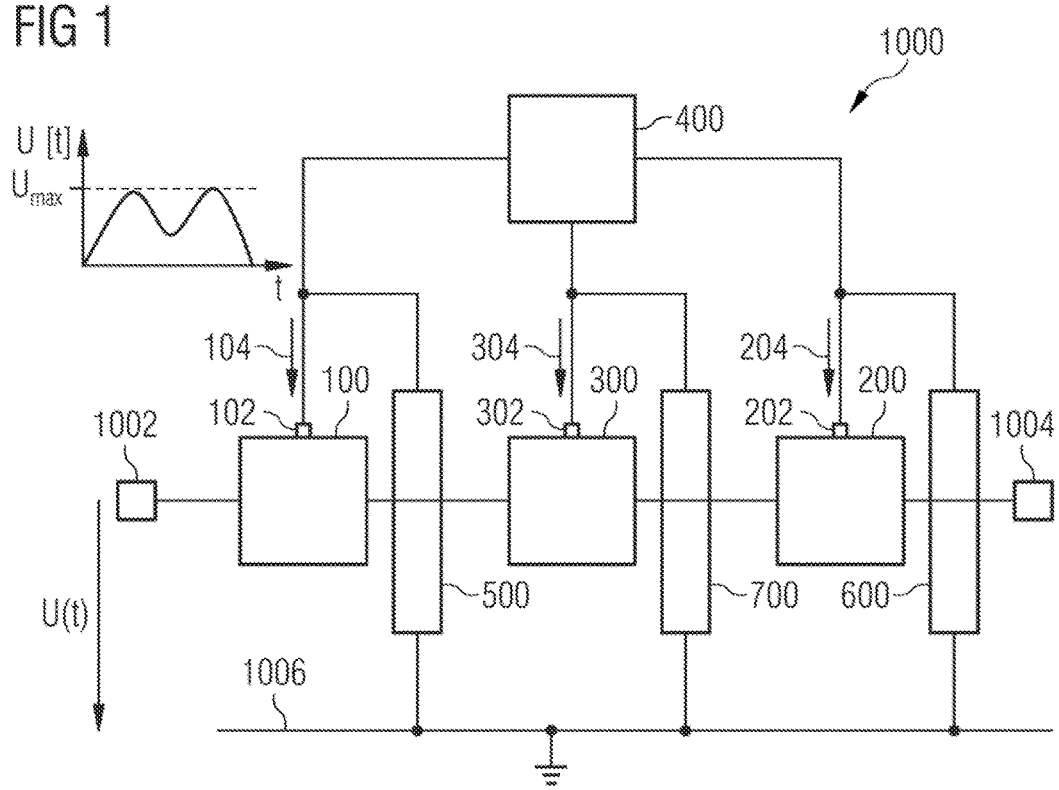
FIG. 1 shows a schematic block diagram of a switching circuitry according to an embodiment.

Before embodiments are described in detail using the accompanying figures, it is to be pointed out that the same or functionality-equal elements are given the same reference numbers in the figures and that a repeated description for elements provided with the same or similar reference numbers is typically omitted.

Hence, descriptions provided for elements having the same reference numbers are mutually exchangeable and applicable.

Embodiments described herein may relate to high voltages and low voltages. Some embodiments described herein may relate to switching circuitries for switching voltages in the range of 5 volts while using transistor elements having a recommended operational voltage being in the range of 2.5 volts. In connection with these embodiments, 5 volts may be understood as high voltage, wherein 2.5 volts may be understood as low voltage. In connection with other embodiments described herein, any voltage being greater than a recommended operational voltage of a transistor element or an applicable operational voltage applicable to transistor elements may be understood as high voltage, wherein a voltage being equal to or less than the recommended operational voltage may be understood as low voltage.

The recommended operational voltage may be a device dependent voltage or a potential between a control terminal such as a gate or a base of a transistor and a further terminal of the transistor such as a source or a drain, a collector or an emitter, respectively. For example, the recommended operational voltage may be indicated in a data sheet of the transistor element. The recommended operational voltage may be a voltage applied to terminals of the transistor element that allows for regular operation without damaging the transistor element by applying overvoltage.

Transistor elements may be designed to be operated at a recommended operational voltage. To enable the transistor elements to be operated with voltage that deviate from the recommended operational voltage, the effective voltage applied may vary within an error window above and/or below the recommended operational voltage. In particular, transistor elements may be operated with voltage levels that are greater than the recommended operational voltage but are still low enough to not or not significantly damage the transistor element. I.E., the applied operational voltage may vary within an allowed range of the error window and may be greater or lower than the recommended operational voltage. Thus, the applicable operational voltage may be a value within the allowed range, in particular a maximum value thereof. Such an applicable voltage level within the allowed range is referred to hereinafter as applicable operational voltage.

Embodiments described herein may relate to the applicable operational voltage that is greater than the recommended operational voltage within the tolerance range of the allowed range. In other words, a level of the applicable operational voltage may be within the allowed range of the recommended operational voltage or the maximum value thereof. For example, the recommended operational voltage may be a mean or average value of the voltage range defined by the allowed range. The tolerance range of the applicable operational voltage may be, for example, at most 35% (e.g. between 0% and 35%), at most 25% (e.g., between 5% and 30%) or at most 25% (e.g., between 10% and 25%) of the recommended operational voltage. In particular, the applicable operational voltage may be higher than the recommended operational voltage such that the applicable operational voltage may exceed the recommended operational voltage by the tolerance range. The applicable operational voltage may even be higher in a currentless or powerless operation mode of the transistor element. Thus, the applicable operational voltage may be higher than the recommended operational voltage within the tolerance range.

Operating a transistor element with the applicable operational voltage may allow for repeatable switching of the transistor element without damaging the transistor element significantly. I.E., a small amount of damage may be tolerable. Thus a trade-off may be made between a tolerable attrition and a used power class of the transistor elements. For example, a number of possible switching cycles or an operational lifetime of the transistor element may be reduced by at most 30%, at most 20% or at most 10% when operating the transistor element with the applicable operational voltage instead of the recommended operational voltage.

Transistor elements may be, for example, CMOS transistors such as N-type or P-type. Other transistor elements may be bipolar transistors. Embodiments described herein relate to CMOS transistors, wherein the embodiments are not limited thereto. Functionality of transistor elements may be transferred to transistor elements of other types (for example, bipolar transistors) and/or other conductivity types (such as between N-type and P-type). Thus, the recommended operational voltage described hereinafter as voltage between a gate terminal and a source terminal ($V_{GSOP}$) is not limited to a voltage between a gate and a source but may also relate to other transistor types or terminals.

Thus, control terminals described herein may relate to a gate terminal of a MOS transistor element or to a base terminal of a bipolar transistor element. A power terminal referred to hereinafter may relate to a source terminal or a drain terminal of a MOS transistor element or may relate to a collector terminal or an emitter terminal of a bipolar transistor element.

FIG. 1 shows a schematic block diagram of a switching circuitry 1000. The switching circuitry 1000 comprises a first port 1002 and a second port 1004. Each of the first port 1002 and the second port 1004 may be used as an input port or as an output port. I.E., an input side and an output side of the switching circuitry 1000 may be switched, i.e. a full voltage swing between the reference potential such as 0 volt and a maximum input voltage may occur on either side and on either port 1002 and 1004. The switching circuitry 1000 may be switched or controlled so as to comprise an ON-State or an OFF-State, i.e., the switching circuitry 1000 may be controlled so as to comprise the ON-State or the OFF-State. Thus, the switching circuitry 1000 may be switched between the ON-State and the OFF-State. During the ON-State, the switching circuitry 1000 may provide an electrical connection between the first port 1002 and the second port 1004. The electrical connection may be understood as providing a low-impedance or low-resistance path between the ports 1002 and 1004. During the OFF-State, the switching circuitry 1000 may electrically disconnect the first port 1002 from the second port 1004. Such a disconnection may be understood as a high-impedance or high-resistance path between the ports 1002 and 1004. Alternatively, the electrical disconnection may comprise a mechanical disconnection, wherein such a mechanical disconnection is not necessary. Thus, electrical disconnection between the ports 1002 and 1004 may be understood as increasing a resistance between both ports 1002 and 1004 so as to reduce or prevent a flow of electrical current between both ports 1002 and 1004.

The switching circuitry 1000 may comprise a cascode transistor element 100 connected to the port 1002. The cascode transistor element 100 may comprise a control terminal 102. The control terminal 102 may be configured to receive a control voltage for controlling a state or condition of the cascode transistor element 100. The cascode transistor element 100 may be, for example, of type "normally on" or of type "normally off". The cascode transistor element 100 may, for example, a N-type metal oxide semiconductor (MOS) transistor element comprising a normally off-configuration. Based on a control voltage 104 applied to the control terminal 102, such as a gate terminal, a conductivity between a source terminal and a drain terminal of the cascode transistor element 100 may be controlled or influenced.

The switching circuitry 1000 may comprise a further cascode transistor element 200 being connected with the port 1004. The transistor element 200 may comprise a control terminal 202 for receiving a control voltage 204 as described in connection with the control terminal 102 and the control voltage 104 with reference to the cascode transistor element 100.

The switching interface 1000 may comprise a switching transistor element 300 comprising a control terminal 302 for receiving a control voltage 304 as described in connection with the cascode transistor element 100. The switching transistor element 300 may be connected between the cascode transistor elements 100 and 200, for example, the switching transistor element 300 may be serially connected between the cascode transistor elements 100 and 200. For example, a source terminal of the cascode transistor element 100 may be connected to a drain terminal of the switching transistor element 300. Further, a source terminal of the switching transistor element 300 may be connected with a drain terminal of the cascode transistor element 200.

In the ON-State of the switching circuitry 1000, cascode transistor elements 100 and 200 and the switching transistor element 300 may comprise a low-impedance or low-resistance condition between the source terminals and the drain terminals. In the OFF-State of the switching circuitry 1000, one or more, preferably all, of the transistor elements 100, 200 and 300 may comprise a high-resistance path between the source terminal and the drain terminal so as to provide the electrical disconnection between the ports 1002 and 1004.

Each of the transistor elements 100, 200 and 300 may comprise a recommended operational voltage (Gate-Source-Operational—VGSOP) $V_{GSOP}$ which may be device-dependent, i.e., it may depend on the specific transistor element. Each of the transistor elements 100, 200 and 300 may be operated with an applicable operational voltage which may also be device-dependent. Thus, a level or a value of the recommended operational voltage $V_{GSOP}$ and/or of the applicable operational voltage may depend on parameters of the transistor element 100, 200, 300 respectively. The transistor elements 100, 200 and 300 may comprise a same recommended operational voltage, i.e. a value of the recommended operational voltage and/or of the applicable operational voltage may be essentially equal. "Essentially equal" may be understood, for example, as being equal within a tolerance range of at most 15%, 10% or 5% of one of the values of the recommended operational voltages of the transistor elements 100, 200 or 300.

The switching circuitry 1000 may comprise a supply signal arrangement 400. The supply signal arrangement 400 may be connected to the control terminals 102, 202 and 302. The supply signal arrangement 400 may be configured to provide the control voltage 104, the control voltage 204 and the control voltage 304. As will be described later in more detail, according to some embodiments, control voltages 104 and 204 may be equal or identical which may allow for having the supply signal arrangement 400 a first port connected to the cascode transistor elements 100 and 200 and a second port connected to the switching transistor element 300. Alternatively, the supply signal arrangement may be configured to provide each of the control voltages 104, 204 and 304 separately. The supply signal arrangement 400 may also be referred to as a charge pump (CP) and may be configured to output a higher voltage when compared to the input voltage U(t) so as to enable switching the transistor elements 100, 200 and 300 at any time.

The switching transistor element 300 may be referred to as the primary switching component of the switching circuitry 1000 or may be referred to as the real switch. The cascode transistor elements 100 and 200 may be referred to as protecting transistors, forming a cascode with the switching transistor element 300. Simplified, the cascode transistor elements 100 and 200 may be arranged for protecting the switching transistor element 300. Protection may be understood in connection with possible overvoltage of the switching circuitry 1000 being configured to receive an input voltage U(t) at the port 1002. The input voltage U(t) may vary over time and may comprise a maximum value $U_{max}$. The maximum value $U_{max}$ may comprise a value being higher when compared to the recommended operational voltage $V_{GSOP}$ of the transistor elements 100, 200 and/or 300 and may be higher than the applicable operational voltage. According to the understanding of embodiments described herein, the maximum voltage $U_{max}$ may be a high voltage when compared to $V_{GSOP}$ being a low voltage. The maximum voltage level $U_{max}$ of the input voltage U(t) may be understood as the maximum voltage level $U_{max}$ being at least 50%, 75% or 100% higher than the recommended operational $V_{GSOP}$. Thus, at first sight, the cascode transistor elements 100 and/or 200 and/or the switching transistor element 300 might suffer damage when the maximum input voltage $U_{max}$ is applied. However, this is not the case as will be described in the following.

A first adjusting circuitry 500 is connected between the control terminal 102 and a reference potential 1006 of the switching circuitry. The reference potential 1006 may be, for example, 0 volts, ground (GND) or any other reference value. The adjusting circuitry 500 may be configured to adjust the control voltage 104 being provided by the supply signal arrangement 400, so that, during the ON-State, the voltage difference between the control voltage 104 and the input voltage U(t) is less than or equal to the applicable operational voltage. For example, the control voltage 104 is provided by the supply signal arrangement 400 so as to comprise a voltage level being at least the input voltage U(t) plus an offset voltage of the cascode transistor element 100. The offset voltage may comprise a threshold voltage enabling to operate the cascode transistor element 100 in a conductive operation mode, e.g. when the cascode transistor element is a normally off N-type CMOS transistor. The offset voltage may, alternatively, comprise a value corresponding to the recommended operational voltage $V_{GSOP}$. At a first time instance, the input voltage U(t) may comprises a voltage level close to or at the maximum value $U_{max}$ and the control voltage 104 may comprise a level being higher than the maximum input voltage $U_{max}$. When the input voltage U(t) is reduced at a second time instance, the voltage difference between the control voltage 104 and the input voltage U(t) would increase at constant control voltage 104 which may lead to a voltage difference being greater than the recommended operational voltage $V_{GSOP}$ and/or the applicable operational voltage which might lead to damage at the cascode transistor element 100. The adjusting circuitry 500 may be configured to adjust the control voltage 104 so as to keep the voltage difference between the control voltage 104 and the input voltage U(t) below or equal to the applicable operational voltage in the ON-State. The adjusting circuitry 500 may be configured to adjust or control the control voltage 104 such that the control voltage 104 remains below or equal to the applicable operational voltage in the OFF-State. Thus, damage to the cascode transistor element 100 may be prevented. The adjusting circuitry 500 and the cascode transistor element 100 may form a first switching circuitry section.

The switching circuitry 1000 comprises an adjusting circuitry 600 being connected between the control terminal 202 of the cascode transistor element 200 and the reference potential 1006. The adjusting circuitry 600 may be configured to adjust the control voltage 204, so that, during the ON-State, the voltage difference between the control voltage 204 and the input voltage U(t) is less than or equal to the applicable operational voltage. The adjusting circuitry 600 may be configured to adjust or control the control voltage 204 such that the control voltage 204 remains below or equal to the applicable operational voltage in the OFF-State. The adjusting circuitry 600 and the cascode transistor element 200 may form a second switching circuitry section.

The switching circuitry 1000 further comprises an adjusting circuitry 700 being connected between the control terminal 302 and the reference potential 1006. The adjusting circuitry 700 may be configured to adjust the control voltage 304, so that, during the ON-State, the voltage difference between the control voltage 304 and the input voltage U(t) is less than or equal to the applicable operational voltage. The adjusting circuitry 700 may be configured to adjust or control the control voltage 304 such that the control voltage 304 remains below or equal to the applicable operational voltage in the OFF-State. The adjusting circuitry 700 and the switching transistor element 300 may for a third switching circuitry section.

Source terminals and/or drain terminals of each of the transistor elements 100, 200 and 300 may carry the input voltage U(t) when the transistor elements 100, 200 and 300 are in a conductive operation mode. Thus, in the ON-State, the input voltage U(t) may be present at the source terminals and the drain terminals of the transistor elements 100, 200 and 300. This allows implementing the adjusting circuitries 500, 600 and 700 in an equal or comparable way, such that explanations given with respect to the adjusting circuitry 500 may also apply to the adjusting circuitries 600 and/or 700. In other words, the adjusting circuitries 500, 600 and 700 may be configured to define the gate voltages in all conditions so as to allow for further protection of the transistor elements.

Thus, although the maximum voltage level $U_{max}$ of the input voltage U(t) being higher than the recommended operational voltage $V_{GSOP}$ and higher than the applicable operational voltage, the control voltages 104, 204 and 304 may be adjusted to a level which is below a critical level so as to prevent damage to the transistor elements 100, 200 and 300.

The trend in Complementary Metal-Oxide-Semiconductor (CMOS) technologies is towards smaller transistor sizes, defined by digital performance and area. Digital core transistors with thinner gate oxides with a voltage class below one volt may be used for such purpose. In CMOS technologies with a minimum length greater than 0.5 micrometers, the same transistor elements have been used for the analogue interface and the digital logic. This may be difficult to implement or even impossible with sub-micrometer CMOS technologies. Here, a special 5 volt (VDD—high voltage; VDDHV) transistor element is usually implemented to support "high voltage" applications. This may increase process complexity and costs. Together with the digital core transistor, typically every technology may provide a double gate oxide transistor. A double gate oxide transistor may relate to an implementation of the transistor with two gate oxides on top of each other, i.e. a double layer of gate oxides. This double gate oxide transistor may have a voltage class in the range of 2.5 volts (VDDHV/2). An analogue device described herein may be understood in a way that as well as the input side as the output side may show an indefinite or uncertain value of voltage and/or that the voltage may vary continuously. In digital drivers at least one side may be discrete, i.e., show a discrete voltage value.

A method for operating a switching circuitry such as the switching circuitry 1000 may comprise a step of providing, during the ON-State, a connecting between the first port 1002 and a second port 1004 and electrically disconnecting, during the OFF-State, the first port 1002 from the second port 1004. The switching circuitry 1000 may comprise the first cascode transistor element 100 having the recommended operational voltage $V_{GSOP}$ and having the applicable operational voltage and comprising the first control terminal 102, the first cascode transistor element 100 being connected with the first port 1002. The switching circuitry 1000 further comprises a second cascode transistor element 200 also having the recommended operational voltage $V_{GSOP}$ and having the applicable operational voltage and comprising a second control terminal 202, the second cascode transistor element 200 being connected with the second port 1004. The switching circuitry 1000 further comprises a switching transistor element 300 also having the recommended operational voltage $V_{GSOP}$ and having the applicable operational voltage and comprising a third control terminal 302, the switching transistor element 300 being serially connected between the first and second cascode transistor elements 100 and 200. The method comprises providing a first control voltage 104 to the first control terminal 102, providing a second control voltage 204 to the second control terminal 202 and providing a third control voltage 304 to the third control terminal 302. The method further comprises adjusting the first control voltage 104 by means of a first source follower 500 connected to the first cascode transistor element 100, so that, during the ON-State, the voltage difference between the first control voltage 104 and the input voltage U(t) is less than or equal to the applicable operational voltage. The method further comprises adjusting the second control voltage 204 by means of a second source follower 600 connected to the second cascode transistor element 200, so that, during the ON-State, the voltage difference between the second control voltage 204 and the input voltage U(t) is less than or equal to the applicable operational voltage. The method further comprises adjusting the third control voltage 304 by means of a third source follower 700 connected to the switching transistor element 300, so that, during the ON-State and during the OFF-State, the voltage difference between the third control voltage 304 and the input voltage U(t) is less than or equal to the applicable operational voltage. A maximum voltage level $U_{max}$ of the input voltage level input voltage U(t) is higher than the applicable operational voltage. In the ON-State, the control voltages 104, 204 and/or 304 may even remain at a value being smaller than or equal to the recommended operational voltage $V_{GSOP}$.

The method may be used to operate other switching circuitries according to embodiments described herein.

A further method for operating switching circuitries receiving between an ON-State and an OFF-State according to embodiments described herein may comprise providing, during the ON-State, a connection between a first port 1002 and a second port 1004 and electrically disconnecting, during the OFF-State, the first port 1002 from the second port 1004. The switching circuitry may comprise switching circuitry sections arranged in series between a first port and a second port, wherein each switching circuitry section comprises a transistor element connected, wherein a first transistor element is arranged between a second and a third transistor element and connected in series hereto. The method may comprise applying the input voltage U(t) at the first port such that the input voltage U(t) comprises a maximum voltage level being higher than the applicable operational voltage and may comprise controlling a control voltage of the first, second and third transistor elements of the switching circuitry sections such that, during the ON-State, an operational voltage of the first, second and third switching transistor elements between a control terminal and a power terminal of the switching transistor elements is less than or equal to the applicable operational voltage of the first, second and third switching transistor elements.

In other words, the charge pump may be configured to provide a voltage being higher to the voltage to be switched so as to enable an overdrive of the voltages being present in the circuitry due to reception at the input port 1002 or the output port 1004.

Figure 2:
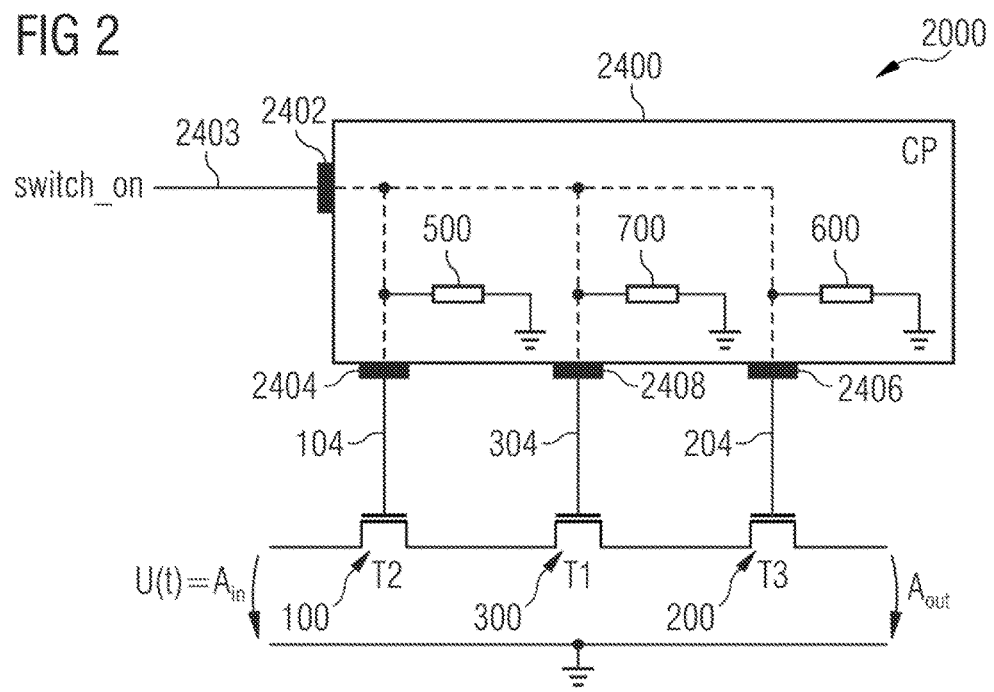
FIG. 2 shows a schematic block diagram of a switching circuitry according to an embodiment, in which a supply signal arrangement may comprise adjusting circuitries.

FIG. 2 shows a schematic block diagram of a switching circuitry 2000 according to an embodiment. The switching circuitry 2000 may be similar to the switching circuitry 1000. The switching circuitry 2000 comprises the transistor elements 100, 200 and 300 being indicated as T2, T3 and T1.

The switching circuitry 2000 comprises a supply signal arrangement 2400. The supply signal arrangement 2400 comprises a port 2402 configured to receive a control signal 2403 being indicated as switch_on. The control signal 2403 may indicate an operation mode, i.e. operation in the ON-State or in the OFF-State of the switching circuitry 2000 and/or may indicate a transition between the ON-State and the OFF-State.

The supply signal arrangement 2400 may comprise the adjusting circuitries 500, 600 and 700 and may be configured to provide the adjusted output voltages 104, 204 and 304 at output ports 2404, 2406, 2408, respectively.

In other words, the switching circuitry 2000 is a possible solution for a realization of an input switch, i.e. a switching circuitry, according to embodiments. The realization may comprise a stack of transistors, i.e. the transistor elements 100, 200 and 300 being connected serially to each other, wherein the transistor elements 100, 200 and 300 may comprise a lower voltage class in terms of the recommended or applicable operational voltage, when compared to the input voltage U(t). The input voltage U(t) is indicated as $A_{in}$ so as to indicate an analogue value of the input voltage U(t). An output voltage being provided by the switching circuitry 2000 is indicated as $A_{out}$ so as to indicate an analogue value of the output voltage.

The switching circuitry 2000 may relate to an implementation of a so-called double stack, which means usage of transistor elements with, at maximum, ratings being equal half of the voltage class to be applied, i.e. the recommended operational voltage is half of the maximum input voltage $U_{max}$ which may also be understood as the maximum voltage level $U_{max}$ of the input voltage U(t) being 100% higher than the recommended operational voltage $V_{GSOP}$. The concept may be extended to other, i.e. bigger or higher voltage, classes, i.e. the maximum voltage level $U_{max}$ of the input voltage U(t) may be more than 200% of the recommended operational voltage $V_{GSOP}$. For example, for allowing switching of a maximum voltage level $U_{max}$ of the input voltage U(t) being at most five times the recommended operational voltage $V_{GSOP}$, four cascode transistor elements may be arranged between the switching transistor element and the first port and four cascode transistor elements may be arranged between the switching transistor element and the second port. In simple terms, the sum of the recommended operational voltages of the cascode transistor elements and the recommended operational voltage of the switching transistor element may indicate a maximum voltage level to be switched. For example, for allowing switching of a maximum voltage level $U_{max}$ being 5 volts, the recommended operational voltage $V_{GSOP}$ being 1 volt, the sum of 4 times $V_{GSOP}$ (4×1 volt=4 volts) plus $V_{GSOP}$ of the switching transistor element (4 volts+1 volt=5 volts) allows for switching up to 5 volts. Thus, at least one further cascode transistor element may be connected between the switching transistor element and the first port and at least one further cascode transistor element may connected between the second port and the switching transistor element. This may allow for switching microcontrollers comprising transistor elements having a voltage class of 1 volt but also using a supply voltage of 5 volts.

The switching circuitry 2000 comprises three transistor elements. The switching transistor element, i.e. the so-called real switch transistor, is in the middle of the serial connection. On one side, a first cascode transistor 100 is arranged and used to half the maximum input voltage $U_{max}$ for the real switch 300 from the input port. On the other side, a second cascode transistor 200 is used to half the maximum voltage for the real switch from the output, i.e. the port 1004, for example, using a summing node. It is noted, that the terms input port and output port are mutually exchangeable and are used for a better understanding only.

All three transistors 100, 200 and 300 may be implemented with half of the voltage class defined from maximum values of $A_{in}$ and $A_{out}$. According to one example, NMOS transistor elements are only used for the transistor elements 100, 200 and 300. According to other examples which will be described later, a so-called T-GATE comprising PMOS and NMOS may be used for implementing at least the switching transistor element 300. A realization as T-GATE may allow the inner side to comprise a high voltage protection which is less complicated to implement. A use of transistor elements 100, 200 and 300 being of type NMOS may allow for an increased protection of each single transistor. Simplified, FIG. 2 shows an analogue input switch with stacked devices.

Figure 3:
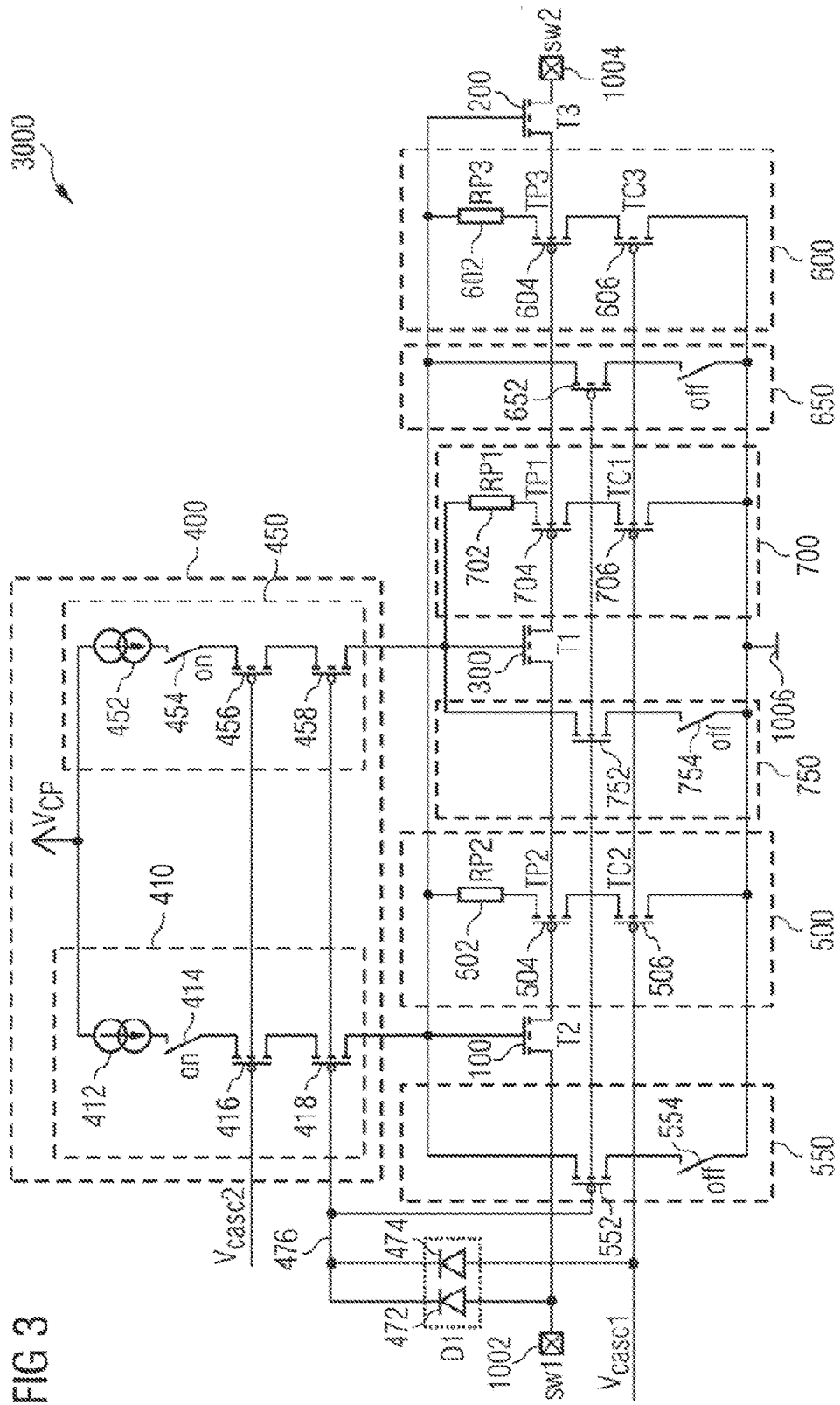
FIG. 3 shows a schematic block diagram of a switching circuitry according to an embodiment, in which the supply signal arrangement may comprise a current mirror.

FIG. 3 shows a schematic block diagram of a switching circuitry 3000 in accordance with embodiments described herein. The switching circuitry 3000 may be similar to the switching circuitry 1000. The switching circuitry 3000 comprises the supply signal arrangement 400. The supply signal arrangement 400 may comprise a current mirror comprising two current mirror branches 410 and 450 being connected to a control potential $V_{CP}$. The control potential may be higher than the maximum input voltage level and higher than the auxiliary signals. For example, the control voltage may be 7.5 volts. The first branch 410 may comprise a current source 412. The second branch 450 may comprise a current source 452. The first branch 410 may further comprise a switch 414 which is configured to comprise a conductive operation mode during the ON-State of the switching circuitry 3000 as indicated by "ON" next to the switch 414. The first branch 410 further comprises transistor elements 416 and 418 which may be, for example, P-type MOS transistor elements comprising a normally-OFF configuration. The second branch 450 may comprise equal or comparable elements, i.e. a switch 454 being configured to have a conductive operation mode in the ON-State of the switching circuitry and a non-conductive operation mode in the OFF-State of the switching circuitry 3000. The second branch 450 may further comprise transistor elements 456 and 458 being connected serially to each other and to the switching element 454 and the current source 452. An order of the elements of the first branch 410 and/or of the second branch 450 may be different from the illustrated order and/or different from each other. For example, the switching element 414 may be arranged between the transistor element 418 and the control terminal of the cascode transistor element 100. Alternatively or addition, the switching element 454 may be arranged between the transistor element 458 and the control terminal of the switching transistor element 300. The switching element 414 and/or the switching element 454 may be implemented, by non-limiting example only, as a transistor element. The switching element 454 may comprise a recommended operational voltage being equal to the other transistor elements in the switching circuitry 3000 but may also comprise a stacked configuration so as to enable higher voltages to be switched.

Control terminals of the transistor elements 418 and 458 may be connected to one or more control voltages. For example, the input voltage and/or a first auxiliary signal being indicated as Vcasc1 may be used as control voltage. For example, the input voltage may be connected to the control terminals via a diode 472 and the first auxiliary signal Vcasc1 may be connected to the control terminals via a diode 472. The diodes 472 and/or 474 may comprise a diode element and/or transistor elements. For example, the diodes 472 and/or 474 may comprise a transistor element such as an n-type MOS transistor with a Gate-Drain bypass. The transistor elements 416 and 456 may be connected to a second auxiliary signal Vcasc2. The auxiliary signals Vcasc1 and Vcasc2 may be connected to control terminals of the respective transistor element and may allow for controlling operation of the transistor elements. The potential $V_{CP}$ may be a high voltage signal comprising a voltage level being higher when compared to the recommended or applicable operational voltage of the transistor elements 416, 418, 456 and/or 458. A level of the auxiliary signals Vcasc1 and/or Vcasc2 may comprise a voltage level such that a voltage difference between the respective auxiliary signal and the potential at a source terminal of the respective transistor element is at most the applicable operational voltage. A control voltage 476 may be used to control one or more of the transistor elements of the switching circuitry 3000. For input voltage levels that are below a certain limit, such as the recommended or applicable operational voltage, Vcasc1 may be used to control the operation of the transistor elements 418 and 458, i.e., the control voltage 476 may essentially correspond to the first auxiliary signal Vcasc1. For input voltage levels that exceed the certain limit, the diodes 472 and 474 may allow for using the input voltage level to control the transistor elements 472 and 474 such that the voltage difference between the power terminal and the control terminal at the transistor elements stays within the recommended or applicable operational voltage. Thus, for high input voltage levels, the control voltage 476 may essentially correspond to the input voltage. In other words, a constant voltage Vcasc1 that is below the recommended operational voltage might lead to an overvoltage at the transistor element 418, when the input voltage increases above the cascode voltage level. By increasing the control voltage at the transistor elements 418 and 458 by applying a higher voltage such as the input voltage the voltage difference may be kept with the limit of the applicable operation voltage. According to other examples, instead of the input voltage other voltages may be used for keeping the voltage difference within predetermined limits. For example, an auxiliary signal may be used such as Vcasc2. Possible voltage levels will be described in more detail in connection with FIG. 5a and FIG. 5b. Vcasc2 may be a highest or high voltage potential to be switched wherein Vcasc1 may be equal to a voltage level that the transistor elements are able to resist.

The control terminals of the cascode transistor elements 100 and 200 may be connected to each other and may both be connected to the first branch 410 of the supply signal arrangement 400 which is referred to hereinafter as a charge pump configured to provide charge carriers to the control terminals of the transistor elements 100, 200 and 300, i.e., the supply signal arrangement 400 may comprise a charge pump circuitry. The control terminal of the switching transistor element 300 may be connected with the second branch 450 of the charge pump 400.

The switching circuitry 3000 may comprise follower paths 500, 600 and 700. The follower path 500 may comprise a resistive element 502 indicated as RP2, a first transistor element 504, indicated at TP2 and a second transistor element 506 indicated at TC2. The transistor elements 504 and 506 are connected to each other in series, wherein the transistor element 506 is connected with the reference potential 1006. A control terminal of the transistor element 504 is connected to a power terminal of the first cascode transistor 100, such as a source terminal. The resistive element 502 may be connected between a power terminal of the transistor element 504, such as a source terminal and the control terminal of the cascode transistor element 100. The follower paths 600 and 700 may comprise similar or equal elements, i.e. the follower path 600 may comprise a resistive element 602 indicated as RP3, a first transistor element 604 indicated as TP3 and a second transistor element 606 indicated as TC3, wherein the follower path 700 may comprise a resistive element 702 indicated as RP1, a first transistor element 704 indicated as TP1 and a second transistor element 706 indicated as TC1. A resistance value of the resistor elements 502, 602 and/or 702 may comprise any suitable value, such as in a range between 1 kΩ and 100 MΩ, between 5 kΩ and 50 MΩ or between 10 kΩ and 10 MΩ. The follower path 600 may be connected between the control terminal of the second cascode transistor element 200 and the reference potential 1006, and wherein the follower path 700 may be connected between the control terminal of the switching transistor element 300 and the reference potential 1006. The follower paths 500 and 600 may be connected to each other in a parallel way and may, for example, be connected to the first mirror path 410. The follower path 700 may be connected to the second mirror path 450.

The transistor elements 504, 604 and 704 may be connected to power terminals of the cascode transistor elements 100 and/or 200 and/or to a power terminal of the switching transistor element 300. In particular, control terminals of the transistor elements 504, 604 and/or 704 may be connected so as to comprise a connection between a control terminal of the respective transistor element 504, 604 and 704 with a power terminal of the cascode transistor element 100 or 200, of the switching transistor element 300 respectively. I.E., the control terminals of the transistor element 504, of the transistor element 604 and of the transistor element 704 may be applied with the same potential, when the cascode transistor elements 100 and 200 and the switching transistor element 300 comprise a conductive operation mode.

The switching circuitry 3000 further comprises switching paths 550, 650 and 750. The switching path 550 may comprise a transistor element 552 and a switching element 554. The transistor element 552 and the switching element 554 may be connected with each other in a serial way, wherein the serial connection is connected between the control terminal of the cascode transistor element 100 and the reference potential 1006. The switching path 550 may be connected to the follower path 500 in a parallel way. Accordingly the switching path 650 may comprise a transistor element 652 and a switching element 654 connected to each other in serial way, and connected to the follower path 600 in a parallel way, i.e., connected between the control terminal of the cascode transistor element 200 and the reference potential 1006. The switching path 750 may comprise a transistor element 752 and a switching element 754 connected to each other in serial way, wherein the switching path 750 may be connected in a parallel way to the follower path 700, i.e., between the control terminal of the switching transistor element 300 and the reference potential 1006.

Control terminals of the transistor elements 552, 752 and 652 may be connected to each other and may be connected to the control voltage 476. Control terminals of the second transistor elements 506, 606 and 706 may be connected to each other and to the first auxiliary signal Vcasc1. Control terminals of the transistor elements 552, 752 and 652 may be connected to each other and to the control voltage 476. As will be described later in more detail, the control voltage may be configured to control an operation mode of the transistor elements 552, 752 and 652.

When comparing the switching paths 550, 650 and 750, the switching path 750 connected with the switching transistor element 300 may comprise a particular difference when compared to the switching paths 550 and 650. The transistor element 552 may be of a complimentary transistor type when compared to the cascode transistor element 100. For example, the cascode transistor element 100 may be of N-type CMOS, wherein the transistor element 552 may be of P-type CMOS. The transistor element 652 may be of a same transistor type, when compared to the transistor element 552 and of a complimentary transistor type, when compared to the cascode transistor element 200. For example, the transistor elements 552 and/or 652 may also be implemented as N-type CMOS and the cascode transistor elements 100 and 200 as P-type CMOS. In difference hereto, the transistor element 752 may be of an equal or same transistor type when compared to the switching transistor element 300. For example, both transistor elements 752 and 300 may be implemented as N-type CMOS or as P-type CMOS.

As indicated by "OFF", the switching elements 554 may be configured to connect the transistor elements 552, 652, 752 respectively with the reference potential 1006 in the OFF-State of the switching circuitry 3000. The switching elements 554, 654 and/or 754 may be equal when compared to the switching elements 414 and/or 454 except for their operation mode normally on or normally off, which may be a complimentary.

Although FIG. 3 illustrates a specific implementation of a switching circuitry and of adjusting circuitries, the teachings disclosed herein are not limited to the specific implementations. According to one aspect, the control voltages of the transistor elements 100, 200 and 300 are controlled so as to avoid damages according to overvoltages. According to embodiments, other circuitries controlling the control voltages may alternatively be implemented.

In other words, using unipolar (P- or N MOS) transistors with lower voltage robustness than the analogue input voltage may be one aspect of the embodiments described herein to form an analogue switch. At least two transistors may be used in series for cascoding. At least one more transistor may be used to form the switch. Thus, the switching transistor element may be referred to as the real switch. This switch can be unipolar or bipolar (P and N MOS as T-GATE) for a rail to rail working scheme, a charge pump may be added to overdrive the gate of the cascode and/or the switch transistor. The real switch T1 may be arranged in the middle between the cascode transistor elements 100 and 200 and may be protected by the two cascodes T3 and T2, i.e., the cascode transistor elements 100 and 200. Three supportive bias voltages may be used, whereby a voltage level of Vcasc2 may be equal to a supply voltage level such as VDDHV (e.g., 5V) and a voltage level of Vcasc1 and/or Vcasc3 may be equal to a level of VDDHV/2 (e.g., 2.5V). Vcasc1 may alternatively be 2.5V plus the threshold voltage of the transistor elements, such as 0.5V. Vcasc1 and/or Vcasc3 may be preferably generated from a resistive divider dividing VDDHV. When switching on the switching circuitry, i.e., when changing into the ON-State, the gate of T1 (switching transistor element 300) is switched on (high) by driving a current from the charge pump to a resistor, the resistive element 702. The resistor is claimed by a source follower on the output of T1. Similar situations may be established by a second resistor 42 (cascode transistor element 100) and a third resistor 43 (cascode resistive element 200). This clamping will avoid over-voltage in case the input or output is close to 0 volts. When switching off the switching circuitry, i.e. when changing to the OFF-State, all three gates are pulled to lower voltages than a source/drain voltage. But, the gates of the transistor elements 100 (T2) and 200 (T3) are not pulled to ground to avoid over-voltages.

The two cascode transistor elements are pulled to one threshold (source follower) voltage higher than the middle voltage Vcasc1. They will not be off in case the input/output voltage is close to zero. The gate of T1 can be pulled to ground, because the voltage on source/drain of this transistor will not higher than $V_{DD}/2$, guaranteed by the two cascode transistor elements T2 and T3. T1 will therefore switch off also for input voltages close to 0 volts.

Figure 4:
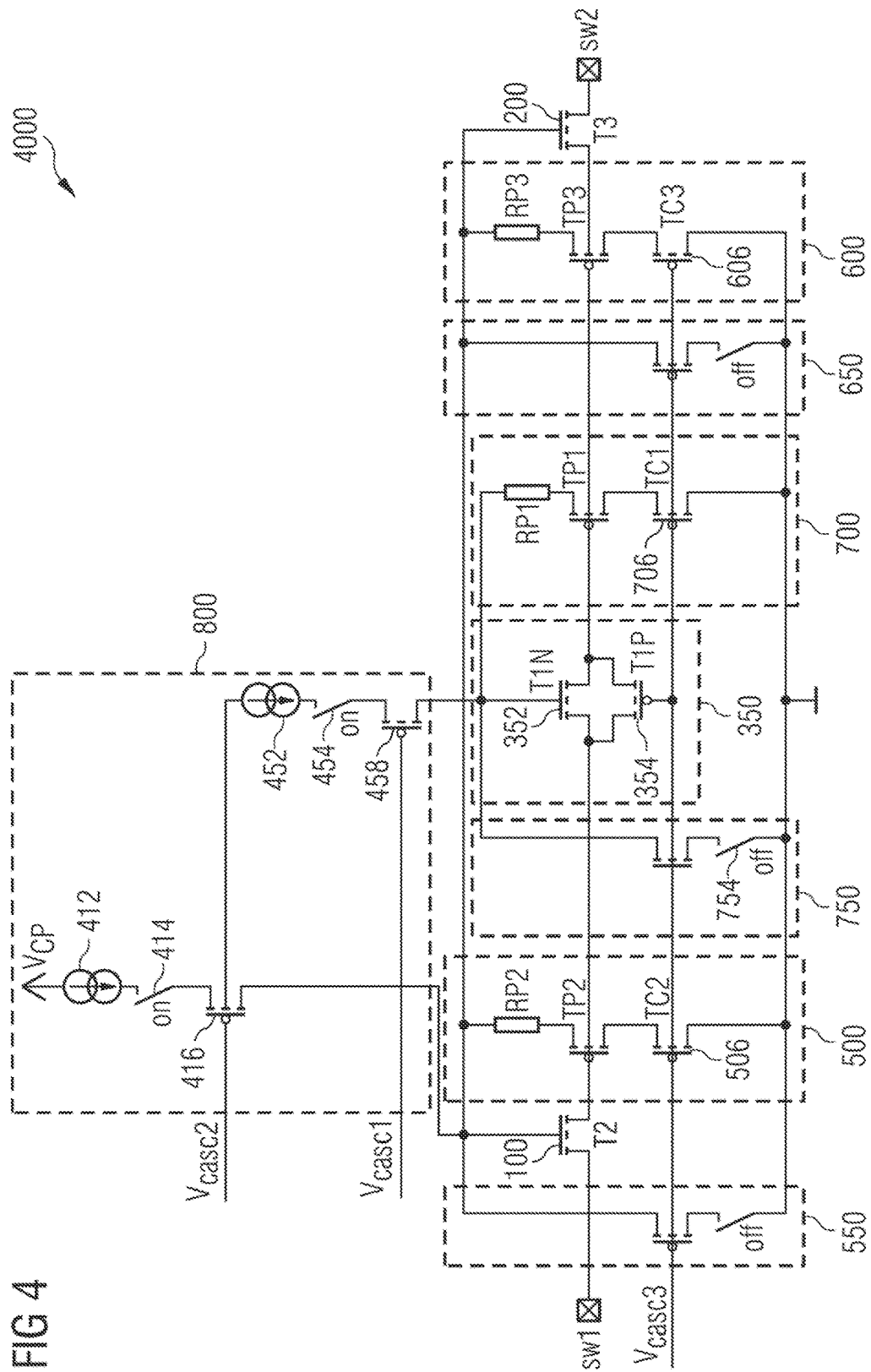
FIG. 4 shows a schematic block diagram of a switching circuitry according to another embodiment, in which the supply signal arrangement is different when compared to the supply signal arrangement of FIG. 3.

FIG. 4 shows a schematic block diagram of a further switching circuitry 4000 according to another embodiment. The switching circuitry 4000 may be similar to the switching circuitry 1000, 2000 or 3000. When compared to the switching circuitry 3000, the supply signal arrangement may differ from the supply signal arrangement 400 of the switching circuitry 3000. Further, the switching transistor element may be implemented as a T-GATE circuit.

Attention is drawn to the configuration of a supply signal arrangement 800 being part of the switching circuitry 4000. When compared to the supply signal arrangement 400, the supply signal arrangement 800 may comprise the current source 412. The switching element 414 and the transistor element 416 may be connected to each other as described for the first mirror path 410, wherein supply signal arrangement 800 may be implemented in absence of the transistor element 418 such that a power terminal of the transistor element 416 may be connected to the control terminals of the cascode transistor elements 100 and 200. The current source 412 may be connected to the potential $V_{CP}$ to drive the current. A difference may now be present between the second mirror path 450 and a configuration of the current source 452, the switching element 454 and the transistor element 458 being part of the supply signal arrangement 800. Instead of forming a current mirror having two branches connected to each other, the current source 452 may be connected to the first auxiliary signal Vcasc2 to drive the current for the switching element 350, the follower path 700 and/or the switching path 750. I.E. instead of the potential $V_{CP}$ driving a current mirror as described for the supply signal arrangement 400, two different potentials $V_{CP}$ and Vcasc2 may be used for providing charge carriers for the switching circuitry 4000. Supplying the current source 452 with the auxiliary signal Vcasc2 instead of a second branch of the current mirror may allow for a lower load for the charge pump. The second auxiliary signal Vcasc2 may be a supply voltage applied to the switching circuitry, such as a supply voltage of a DC-interface. Such a power supply may be easier to load, i.e., it may provide a high amount of power without requiring additional or different elements providing or fusing the power.

The different supply signal arrangement 800 may allow for a simplified circuitry of other elements of the switching circuitry 4000 when compared to the switching circuitry 3000. For example, the control terminals of the transistor elements 552, 752 and 652 may be connected to each other and may be connected the control terminals of the second transistor elements 506, 606 and 706. This may allow for using a third auxiliary signal Vcasc3 as the control voltage. The third auxiliary signal Vcasc3 may be, for example, of a level which corresponds to the recommended operational voltage, at least within a tolerance range. The tolerance range may be, for example, at most 10%, 20%, 30% above or below the recommended operational voltage. Thus, the auxiliary signals Vcasc1 and Vcasc3 may be the same potential. This may allow for connecting both potentials with each other. The third auxiliary signal Vcasc3 may provide an advantage for input voltages being greater than the recommended operational voltage and may be static when compared to the dynamic control voltage 476 described in connection with FIG. 3. Using static voltage levels may provide for a simple circuitry. Thus, an arrangement of the diodes 472 and 474 may be not necessary.

The transistor elements 506, 552, 606, 652 and 706 may be a p-type MOS transistor. This may allow for switching the switching transistor element 300 even in absence of a supply voltage of the other transistor elements and may thus allow for a high security.

The switching transistor element 350 may comprise a first transistor element 352 and a second transistor element 354 connected to each other according to a T-GATE configuration. Simplified, a T-GATE may be described as a source terminal of one transistor element 352 or 354 being connected to the drain terminal of the other transistor element 354, 352 respectively. A control terminal of the transistor element 354 may be connected to the third auxiliary signal Vcasc3. When compared to the switching circuitry 2000 or the switching circuitry 3000, the transistor element 354 may be an additional transistor element connected to the transistor element 300 so as to form the T-GATE circuitry. In other words, a NMOS and a PMOS may form a T-GATE switch. The analogue input voltage $V_{in}$ may connect to the T-GATE. Alternatively, at least two T-GATEs may be used as a switching transistor element and may be connected in series to enable better isolation. The analogue input voltage $V_{in}$ may be connected to the at least one T-GATE. All the outputs of the T-GATEs may be connected together to a summing note. The summing note may be the input of an analogue-digital-converter—ADC or a pin of a test multiplexer. On both sides of the T-GATE the full voltage swing may occur.

In other words, a high voltage may be switched using low-voltage transistors only, for example, having 2.5 volts as the recommended operational voltage $V_{GSOP}$. I.E., the switching circuitry may be realized in the absence of transistor elements comprising, as recommended operational voltage $V_{GSOP}$, a supply voltage, sometimes referred to as $V_{DD}$ such as 5.0 volts. Thus, embodiments described herein may allow for avoiding the necessity of a transistor fitting to the voltage class of the application such as a 5.0 volt application using a 5.0 volt transistor. The supply voltage $V_{DD}$ may refer to an integrated circuit being integrated on a semiconductor substrate together with the switching circuitry. A typical value of $V_{DD}$ may be 5 volts. I.E., the supply voltage $V_{DD}$ may be the supply voltage of the integrated circuit. The maximum voltage level of the input voltage $V_{in}$ may correspond to the supply voltage of the integrated circuit. Thus, the recommended operational voltage $V_{GSOP}$ may equal half of a supply voltage $V_{DD}$ of the integrated circuit.

FIG. 5a illustrates in a schematic block diagram the ON-State of the switching circuitry 4000. In the schematic block diagram, there are also illustrated potential values applied to transistor elements of the switching circuitry 4000. Those voltage levels are used as example values only and shall not limit the embodiments described herein. In particular, based on other, further or different transistor elements or different voltage levels to be switched by the switching circuitry 4000, other, i.e., higher or lower voltage levels may be used for each of the described voltage levels.

In the present example, an input voltage $V_{in}$ that may correspond to the input voltage U(t) may be between 0 volts and 5 volts. The input voltage $V_{in}$ is to be switched from the input port 1002 to the output port 1004. In the ON-State, the switching elements 414 and 454 comprise a conductive state; simplified, the switches are closed. The switching elements 554, 654 and 754 may comprise a high-impedance state; simplified, the switching elements may comprise an OPEN-State.

A threshold voltage $V_{th}$ of the transistor elements of the switching circuitry 4000 shall be equal to 0.5 volts in the present example. The transistor elements, in particular the cascode transistor elements and the switching transistor elements may be implemented as transistor elements comprising 2.5 volts as the recommended operational voltage $V_{GSOP}$. Thus, the recommended operational voltage $V_{GSOP}$ shall be 2.5 volts in the present example, a maximum applicable operational voltage shall be, for example, 3.25 V which corresponds to an allowed range (tolerance range) of 30% of the recommended operational voltage. The auxiliary signals Vcasc1 and Vcasc3 shall be equal to 2.5 volts and may be connected to each other, wherein the auxiliary signal Vcasc2 shall be equal to 5.0 volts. The voltage level of the charge pump of 7.5 volts may be obtained by adding the recommended operational voltage and the supply voltage. The configuration of the switching circuitry 4000 and the operation mode may enable the effect that at the control gate of the first cascode transistor element 100 a voltage level being equal to $V_{in}$+2.5 volts is applied. Based on the parallel connection with the second cascode transistor element 200, the same voltage level is applied to the control terminal of the second cascode transistor element 200. The resistive elements 502 and 702 may be configured to provide a voltage drop being equal to 2.0 volts. In combination with the voltage drop being caused by the threshold voltage $V_{th}$ of the transistor element 504, a combined voltage drop of 2.5 volts may be obtained between the source terminal of the cascode transistor element 100 and the control terminal thereof.

Thus, based on the charge pump providing the charge carriers and based on the voltage being subjected to the control terminals of the cascode transistor elements 100 and 200, to the control terminal of the switching transistor element 352, respectively, a varying input voltage $V_{in}$ may lead to a varying voltage drop over the resistive elements such that the circuitry remains operational, i.e., the transistor elements of the circuitry may be switched by the auxiliary signals and by the input voltage, wherein, the same time, the voltage difference between the control terminal and the power terminal, for example, the gate-source-voltage, remains within the boundaries of the recommended operational voltage $V_{GSOP}$ and/or the applicable operational voltage. An example control voltage of the supply signal arrangement may be 7.5 volts. Simplified, during the ON-State, a voltage drop over the respective resistive element adjusts the respective control voltage. In other words, during the ON-State, a voltage drop over the resistive element 502 may adjust the control voltage being applied to the cascode transistor element 100. Further, during the ON-State, a voltage drop over the resistive element 602 may adjust the control voltage of the cascode transistor element 200. Further, during the ON-State, a voltage drop over the resistive element 702 may adjust the control voltage of the switching transistor element 352.

Thus, the voltage drop of 2.5 volts may be kept in the range of the recommended operational voltage, although an input voltage is applied that exceeds the recommended operational voltage $V_{GSOP}$ and/or the applicable operational voltage. When drawing attention now to the transistor element 458 being connected with the current source 452, the same principle applies. Although a voltage of 5.0 volts is applied to a source terminal of the transistor element 458, based on the auxiliary signal Vcasc1 having a voltage of 2.5 volts, a voltage difference between the control terminal and the power terminals of the transistor element 458 may be kept in the range of the recommended operational voltage $V_{GSOP}$ and/or the applicable operational voltage. Thus, a maximum voltage of the input voltage may be higher than the recommended operational voltage and/or higher than the applicable operational voltage.

Based on the circuitry of the supply signal arrangement, a voltage being also equal to the input voltage $V_{in}$+2.5 volts is applied to the control terminal of the switching transistor element 352 for input voltages being at most the recommended operational voltage of 2.5 volts. For input voltages being greater than the recommended operational voltage, the p-type MOS 354 is switched. In a case when the transistor elements 352 and 354 saturate in a non-linear way, the applied voltage at the transistor element 352 may be described by the formula $$\min\{V_{in}+2.5\text{V}; Vcasc2\}$$

Thus, the voltage level at the control terminal of the transistor element 352 may be at most the level of the second auxiliary signal Vcasc2. A control terminal of the transistor element 354 is applied with a voltage of 2.5 volts for input voltages being at most the recommended operational voltage of 2.5 volts. Thus, each transistor element in the switching circuitry may be applied with voltages that are kept within the voltage range of the recommended operational voltage $V_{GSOP}$ or at least the applicable operational voltage.

As has been described with reference to FIG. 4, the supply signal arrangement may comprise a different configuration, such as the configuration of the supply signal arrangement 400. There, a current mirror may be realized, wherein one path of the current mirror may be connected with the switching transistor element 350. Alternatively or in addition, the switching transistor element 300 may be arranged. Although being described as being connected in parallel to each other, i.e., the current source 412 being connected to the cascode transistor elements 100 and 200, at least one current source may be provided for each of the cascode transistor elements 100 and 200, i.e., they may be connected different from in parallel to each other.

FIG. 5b shows the schematic block diagram of FIG. 5a, wherein the switching circuitry 4000 comprises the OFF-State. In the OFF-State, the switching elements 554, 654 and 754 may comprise a low-impedance state, i.e., the switches are closed, wherein the switching elements 414 and 454 comprise the high-impedance state. Based thereon, a voltage being approximately 3.0 volt is subjected to the control terminals of the cascode transistor elements 100 and 200. The level of 3 volts may be higher than the recommended operational voltage but may still be within the maximum applicable operational voltage, i.e., within the allowed range. I.e., the cascode transistor elements 100 and 200 may remain undamaged. In particular, in the OFF-state, a low amount of current is transported between the first port 1002 and the second port 1004 and thus though the cascode transistor elements 100 and 200, which may allow for increasing voltage levels above the recommended operational voltage without causing damage. Different hereto, a voltage being equal to the reference voltage 1006, for example, 0 volts, may be subjected to the control terminal of the switching transistor element 352, the switching transistor element 300 respectively. This may be obtained based on the transistor element 752 being an N-type CMOS transistor such as the switching transistor element 352, the switching transistor element 300, respectively. Based on the auxiliary signal Vcasc3 being connected to the control terminal of the transistor element 752 and based on the closed state of the switching element 754, the control terminal of the switching transistor element 352, the switching transistor element 300, respectively, may be connected to the reference voltage 1006. Thus, based on the first cascode transistor element 100 and the second cascode transistor element 200 and the switching transistor element 352 or 300 having the same conductivity type and/or based on the first cascode transistor element 100 and the second cascode transistor element 200 and the switching transistor element 352, 300, respectively, being implemented by an identical transistor type, a symmetrical circuitry may be obtained. Based on the transistor element 752 being of equal type when compared to the switching transistor element 352, 300, respectively, the so-called real switch may be connected to the reference voltage, i.e., switched to 0.

In the ON-state of FIG. 5a, the voltages applied to the transistor elements may be below or equal to the applicable operational voltage or even below or equal to the recommended operational voltage. In the OFF-state of FIG. 5b, the voltage may exceed the recommended operational voltage within the tolerance range of the applicable operational voltage.

The symmetry of the circuitries according to the present embodiments may allow for the first and second cascode transistor elements 100 and 200 and the switching transistor elements 352 and 354, 300, respectively to be implemented as so-called double gate oxide transistors the switching circuitries 1000, 2000, 3000 and/or 4000 may further be implemented by transistor elements of a same or equal processing method. When compared to known switching circuitries, an arrangement of a switching transistor differing from other transistor elements of the circuitry may be avoided. This may allow for a common manufacturing process which may be realized with a low amount of time which may allow for a high through put of the process and/or for a low amount of costs for implementing the switching circuitry.

A voltage level on the so-called input side between the first port 1002 and the transistor element 352 may be at most 2.5 volts. A voltage level on the so-called output side between the second port 1004 and the transistor element 352 may be at most 2.5 volts. In particular, both voltage levels may follow the determination rule:

$$\min\{V_{in}; 2.5V\}$$

Simplified, the voltage levels may follow the input voltage $V_{in}$ up to a level of 2.5 volts, when the cascode transistor element 100 switches on. At low voltages e.g., 0 volts, the cascode transistor element 100 may comprise a conductive operation mode. At input voltage levels above 2.5 volts, the cascode transistor element 100 provides cascode functionality, i.e., the voltage level gets limited. The voltage level at the input side may follow the voltage level at the first port 1002, wherein the voltage level at the output side may follow the voltage level at the second port according to the determination rule $$\min\{V_{out}; 2.5V\}$$

In the embodiment described with respect to FIGS. 5a and 5b, the recommended operational voltage $V_{GSOP}$ may equal half of the maximum input voltage level of the input voltage $V_{in}$. According to other embodiments, a different relationship between the recommended operational voltage $V_{GSOP}$ and the maximum input voltage level of the input voltage $V_{in}$ may be obtained. The relationship may be influenced by the input voltage and/or by the recommended operational voltage $V_{GSOP}$ independently from each other. Further, the switching circuitries according to the embodiments described herein may be varied so as to allow for a different relationship between the maximum input voltage level of the input voltage $V_{in}$ and the recommended operational voltage. For example, when referring to the source follower path 500 or any other source follower described herein, a voltage drop may be obtained over the resistive element 502 over the transistor element 504 and over the transistor element 506. Each of the elements allows for a voltage drop being in the range of 2.5 volts between the voltage $V_{CP}$ being 7.5 volts down to the reference voltage 1006. Thus, when using, for example, a higher input-voltage, and therefore using a higher voltage $V_{CP}$, the same type of transistor elements may be used when using further transistor elements allowing for further voltage drops between the highest voltage and the reference voltage.

FIG. 6 shows a schematic block diagram of a DC-interface 6000 according to an embodiment. The DC-interface 6000 may comprise the switching circuitry 1000. Alternatively or in addition, the DC-interface 6000 may comprise a different switching circuitry according to embodiments described herein, such as the switching circuitry 2000, the switching circuitry 3000 and/or the switching circuitry 4000. The DC-Interface 6000 may be powered by a supply voltage $V_{DD}$, for example, 5.0 volt. An integrated circuit 6100 having integrated the switching circuitry 1000 may use the voltage $V_{DD}$ as supply voltage. Further, low voltage transistor elements may be used to ensure protection of the cascode and of the switching transistor elements.

The DC-interface may be, for example, a sensor interface connectable to a power sink such as at least one microcontroller and/or at least one sensor element. For example, a hall sensor, a knock sensor and/or a low-frequency senor using frequencies below 1 MHz may be connected to the second port 1004 of the switching circuitry 3000. Alternatively or in addition, a plurality of power sinks may be connected to the second port. This may allow, for example, for multiplexing a plurality of sensors connected commonly to the second port.

Embodiments described herein may allow for secure switching of voltages being higher than a recommended operational voltage and/or applicable operational voltage of transistor elements used for switching.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A switching circuitry to provide, during an ON-State, a connection between a first port for receiving an input voltage and a second port and to electrically disconnect, during an OFF-State, the first port from the second port, the switching circuitry comprising:
   a first cascode transistor element having an applicable operational voltage and comprising a first control terminal, the first cascode transistor element being connected with the first port of the switching circuitry; and
   a second cascode transistor element also having the applicable operational voltage and comprising a second control terminal, the second cascode transistor element being connected with the second port of the switching circuitry;
   a switching transistor element also having the applicable operational voltage and comprising a third control terminal, the switching transistor element being serially connected between the first and second cascode transistor elements; and
   a supply signal arrangement directly connected to the first control terminal, the second control terminal, and the third control terminal, wherein the supply signal arrangement is configured to provide a first control voltage to the first control terminal, to provide a second control voltage to the second control terminal and to provide a third control voltage to the third control terminal;
   wherein the first cascode transistor element is connected to a first adjusting circuitry, the first adjusting circuitry being connected between the first control terminal and a reference potential node and being configured to adjust the first control voltage, so that, during the ON-State, the voltage difference between the first control voltage and the input voltage is less than or equal to the applicable operational voltage;
   wherein the second cascode transistor element is connected to a second adjusting circuitry, the second adjusting circuitry being connected between the second control terminal and the reference potential node and being configured to adjust the second control voltage, so that, during the ON-State, the voltage difference between the second control voltage and the input voltage is less than or equal to the applicable operational voltage;
   wherein the switching transistor element is connected to a third adjusting circuitry, the third adjusting circuitry being connected between the third control terminal and the reference potential node and being configured to adjust the third control voltage, so that, during the ON-State, the voltage difference between the third control voltage and the input voltage is less than or equal to the applicable operational voltage; and
   wherein a maximum voltage level of the input voltage is higher than the applicable operational voltage.

2. The switching circuitry of claim 1, wherein the first adjusting circuitry is configured to adjust the first control voltage, so that, during the OFF-State, the voltage difference between the first control voltage and the input voltage is less than or equal to the applicable operational voltage;
   wherein the second adjusting circuitry is configured to adjust the second control voltage, so that, during the OFF-State, the voltage difference between the second control voltage and the input voltage is less than or equal to the applicable operational voltage; and
   wherein the third adjusting circuitry is configured to adjust the third control voltage, so that, during the OFF-State, the voltage difference between the third control voltage and the input voltage is less than or equal to the applicable operational voltage.

3. The switching circuitry of claim 1, wherein the applicable operational voltage is higher within a tolerance range than a recommended operational voltage of the first cascode transistor element, the second cascode transistor element, and the switching transistor element, wherein the tolerance range is at most 35% of the recommended operational voltage.

4. The switching circuitry of claim 1, wherein the first adjusting circuitry comprises a first source follower having a first resistive element, wherein, during the ON-State, a voltage drop over the first resistive element adjusts the first control voltage;
   wherein the second adjusting circuitry comprises a second source follower having a second resistive element, wherein, during the ON-State, a voltage drop over the second resistive element adjusts the second control voltage;
   wherein the third adjusting circuitry comprises a third source follower having a third resistive element, wherein, during the ON-State, a voltage drop over the third resistive element adjusts the third control voltage.

5. The switching circuitry of claim 1, wherein the supply signal arrangement comprises a charge pump circuitry.

6. The switching circuitry of claim 4, wherein the supply signal arrangement comprises a charge pump circuitry further comprising a current mirror circuitry, wherein the current mirror circuitry comprises:
   a first branch being connected to the first source follower and the second source follower, and
   a second branch connected to the third source follower.

7. The switching circuitry of claim 1,
   wherein the first adjusting circuitry comprises a fourth transistor element, wherein, during the OFF-State, the fourth transistor element is connected between the first control terminal and the reference potential node;
   wherein the second adjusting circuitry comprises a fifth transistor element, wherein, during the OFF-State, the fifth transistor element is connected between the second control terminal and the reference potential node; and wherein the third adjusting circuitry comprises a sixth transistor element, wherein, during the OFF-State, the sixth transistor element is connected between the third control terminal and the reference potential node.

8. The switching circuitry of claim 7,
wherein the fourth transistor element and the first cascode transistor element have complementary transistor types;
wherein the fifth transistor element and the second cascode transistor element have complementary transistor types;
wherein the sixth transistor element and the switching transistor element have a same transistor type.

9. The switching circuitry of claim 7, wherein the fourth transistor element comprises a fourth control terminal, wherein the fifth transistor element comprises a fifth control terminal and wherein the sixth transistor element comprises a sixth control terminal, wherein, during the OFF-State, the fourth, fifth and sixth control terminals are connected with a voltage level which corresponds to an applicable operational voltage of the fourth, fifth and sixth transistor elements.

10. The switching circuitry of claim 1, wherein the first cascode transistor element, the second cascode transistor element, and the switching transistor element have the same conductivity type.

11. The switching circuitry of claim 1, wherein the first cascode transistor element, the second cascode transistor element, and the switching transistor element are implemented by an identical transistor type.

12. The switching circuitry of claim 1, wherein the switching transistor element is implemented as a T-GATE circuit.

13. The switching circuitry of claim 1, wherein the first cascode transistor element, the second cascode transistor element and the switching transistor element are implemented as double gate oxide transistors.

14. The switching circuitry of claim 1, wherein the first cascode transistor element, the second cascode transistor element and the switching transistor element comprise 2.5 V as a recommended operational voltage.

15. The switching circuitry of claim 1, wherein the switching circuitry is realized in absence of transistor elements comprising, as a recommended operational voltage, a supply voltage level of an integrated circuit being integrated on a semiconductor substrate together with the switching circuitry.

16. The switching circuitry of claim 1, wherein the maximum voltage level of the input voltage corresponds to a supply voltage level of an integrated circuit being integrated on a semiconductor substrate together with the switching circuitry.

17. The switching circuitry of claim 1, wherein a recommended operational voltage of the first cascode transistor element, the second cascode transistor element, and the switching transistor element equals a half of the maximum input voltage level of the input voltage.

18. The switching circuitry of claim 1, wherein a recommended operation voltage of the first cascode transistor element, the second cascode transistor element, and the switching transistor element equals a half of a supply voltage level of an integrated circuit being integrated on a semiconductor substrate together with the switching circuitry.

19. The switching circuitry of claim 1, wherein at least a third cascode transistor element is connected between the switching transistor element and the first port and wherein at least a fourth cascode transistor element is connected between the second port and the switching transistor element.

20. A DC-interface comprising a switching circuitry to provide, during an ON-State, a connection between a first port for receiving an input voltage and a second port and to electrically disconnect, during an OFF-State, the first port from the second port, the switching circuitry comprising:
a first cascode transistor element having an applicable operational voltage and comprising a first control terminal, the first cascode transistor element being connected with the first port of the switching circuitry; and
a second cascode transistor element also having the applicable operational voltage and comprising a second control terminal, the second cascode transistor element being connected with the second port of the switching circuitry;
a switching transistor element also having the applicable operational voltage and comprising a third control terminal, the switching transistor element being serially connected between the first and second cascode transistor elements; and
a supply signal arrangement directly connected to the first control terminal, the second control terminal, and the third control terminal, wherein the supply signal arrangement is configured to provide a first control voltage to the first control terminal, to provide a second control voltage to the second control terminal and to provide a third control voltage to the third control terminal;
wherein the first cascode transistor element is connected to a first adjusting circuitry, the first adjusting circuitry being connected between the first control terminal and a reference potential node and being configured to adjust the first control voltage, so that, during the ON-State, the voltage difference between the first control voltage and the input voltage is less than or equal to the applicable operational voltage;
wherein the second cascode transistor element is connected to a second adjusting circuitry, the second adjusting circuitry being connected between the second control terminal and the reference potential node and being configured to adjust the second control voltage, so that, during the ON-State, the voltage difference between the second control voltage and the input voltage is less than or equal to the applicable operational voltage;
wherein the switching transistor element is connected to a third adjusting circuitry, the third adjusting circuitry being connected between the third control terminal and the reference potential node and being configured to adjust the third control voltage, so that, during the ON-State, the voltage difference between the third control voltage and the input voltage is less than or equal to the applicable operational voltage; and
wherein a maximum voltage level of the input voltage is higher than the applicable operational voltage.

21. A method for operating a switching circuitry receiving an input voltage between an ON-State and an OFF-State, the method comprising:
providing, during the ON-State, a connection between a first port and a second port and electrically disconnecting, during the OFF-State, the first port from the second port;
wherein the switching circuitry comprises:
a first cascode transistor element having an applicable operational voltage and comprising a first control terminal, the first cascode transistor element being connected with the first port of the switching circuitry;
a second cascode transistor element also having the applicable operational voltage and comprising a second control terminal, the second cascode transistor element being connected with the second port of the switching circuitry;
a switching transistor element also having the applicable recommended operational voltage and comprising a third control terminal, the switching transistor element being serially connected between the first and second cascode transistor elements; and
a supply signal arrangement directly connected to the first control terminal, the second control terminal, and the third control terminal;
providing, by the supply signal arrangement, a first control voltage to the first control terminal;
providing, by the supply signal arrangement, a second control voltage to the second control terminal;
providing, by the supply signal arrangement, a third control voltage to the third control terminal;
adjusting the first control voltage by means of a first source follower connected to the first cascode transistor element and to a reference potential node, so that, during the ON-State, the voltage difference between the first control voltage and the input voltage is less than or equal to the applicable operational voltage;
adjusting the second control voltage by means of a second source follower connected to the second cascode transistor element and to the reference potential node, so that, during the ON-State, the voltage difference between the second control voltage and the input voltage is less than or equal to the applicable operational voltage; and
adjusting the third control voltage by means of a third source follower connected to the switching transistor element and to the reference potential node, so that, during the ON-State, the voltage difference between the third control voltage and the input voltage is less than or equal to the applicable operational voltage;
wherein a maximum voltage level of the input voltage is higher than the applicable operational voltage.

22. The method of claim 21, further comprising:
adjusting the first control voltage, so that, during the OFF-State, the voltage difference between the first control voltage and the input voltage is less than or equal to an applicable operational voltage;
adjusting the second control voltage, so that, during the OFF-State, the voltage difference between the second control voltage and the input voltage is less than or equal to the applicable operational voltage; and
adjusting the third control voltage, so that, during the OFF-State, the voltage difference between the third control voltage and the input voltage is less than or equal to the applicable operational voltage.

23. The method of claim 21, wherein the applicable operational voltage is higher within a tolerance range than a recommended operational voltage of the first cascode transistor element, the second cascode transistor element and the switching transistor element, wherein the tolerance range is at most 35% of the recommended operational voltage.

24. A method for operating a switching circuitry receiving an input voltage between an ON-State and an OFF-State, the method comprising:
providing, during the ON-State, a connection between a first port and a second port and electrically disconnecting, during the OFF-State, the first port from the second port;
wherein the switching circuitry comprises:
switching circuitry sections arranged in series between a first port and a second port, wherein each switching circuitry section comprises a transistor element, wherein a first transistor element is arranged between a second transistor element and a third transistor element and connected in series hereto; and
a supply signal arrangement directly connected to control terminals of the first transistor element, the second transistor element, and the third transistor element;
applying the input voltage at the first port such that the input voltage comprises a maximum voltage level being higher than an applicable operational voltage of the transistor elements; and
controlling, by the supply signal arrangement, a control voltage of the first, second, and third transistor elements of the switching circuitry sections such that, during the ON-State, an operational voltage of the first, second, and third transistor elements between a control terminal and a power terminal of the transistor elements is less than or equal to the applicable operational voltage of the first, second, and third transistor elements.

25. The method of claim 24, further comprising controlling the control voltage of the second and of the third transistor elements of the switching circuitry sections such that, during the OFF-State, the operational voltage of the first, second, and third transistor element is less than or equal to the applicable operational voltage.

* * * * *